(12) United States Patent
Iwaji

(10) Patent No.: US 10,508,337 B2
(45) Date of Patent: Dec. 17, 2019

(54) ATOMIC LAYER DEPOSITION-INHIBITING MATERIAL

(71) Applicant: Murata Manufacturing Co., Ltd., Nagaokakyo-shi, Kyoto-fu (JP)

(72) Inventor: Naoki Iwaji, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 15/689,187

(22) Filed: Aug. 29, 2017

(65) Prior Publication Data

US 2017/0356086 A1 Dec. 14, 2017

Related U.S. Application Data

(63) Continuation of application No. PCT/JP2016/057067, filed on Mar. 8, 2016.

(30) Foreign Application Priority Data

Mar. 13, 2015 (JP) .................. 2015-051240

(51) Int. Cl.
*C08F 214/18* (2006.01)
*C23C 16/455* (2006.01)
*C23C 16/04* (2006.01)
*H01G 4/33* (2006.01)
*H01G 4/12* (2006.01)
(Continued)

(52) U.S. Cl.
CPC .......... *C23C 16/45525* (2013.01); *C08K 5/02* (2013.01); *C23C 16/04* (2013.01); *C23C 16/303* (2013.01); *C23C 16/45534* (2013.01);

*H01G 4/008* (2013.01); *H01G 4/085* (2013.01); *H01G 4/12* (2013.01); *H01G 4/186* (2013.01); *H01G 4/33* (2013.01); *H01L 21/0212* (2013.01)

(58) Field of Classification Search
CPC ....... C08F 214/18; C09D 163/00; H01G 4/12; H01G 4/33; C23C 16/04
See application file for complete search history.

(56) References Cited

U.S. PATENT DOCUMENTS 6,039,808 A 3/2000 Toyoda et al.
6,887,927 B2* 5/2005 Grootaert ................ C08F 14/18
524/167

(Continued)

FOREIGN PATENT DOCUMENTS

EP 1383811 * 11/2009 ............ C08F 214/18
JP H10251850 A 9/1998
(Continued)

OTHER PUBLICATIONS

Cioffi, N., et al., "Analysis of the Surface Chemical Composition and Morphological Structure of Vapor-Sensing Gold-Fluoropolymer Nanocomposites". Chem. Mater. 2002, 14, 804-811.*
(Continued)

*Primary Examiner* — Bret P Chen
(74) *Attorney, Agent, or Firm* — Arent Fox LLP

(57) ABSTRACT

An atomic layer deposition-inhibiting material composed of a fluorine-containing resin that has a fluorine content of 30 at % or greater, has at least one tertiary carbon atom and quaternary carbon atom, and lacks ester groups, hydroxyl groups, carboxyl groups, and imide groups.

3 Claims, 3 Drawing Sheets

(51) Int. Cl.
  *C08K 5/02* (2006.01)
  *C23C 16/30* (2006.01)
  *H01G 4/18* (2006.01)
  *H01L 21/02* (2006.01)
  *H01G 4/008* (2006.01)
  *H01G 4/08* (2006.01)

(56) References Cited

U.S. PATENT DOCUMENTS

| | | | | |
|---|---|---|---|---|
| 7,678,848 | B2* | 3/2010 | Malvasi | C08F 6/16 523/310 |
| 8,017,183 | B2 | 9/2011 | Yang et al. | |
| 8,030,212 | B2 | 10/2011 | Yang et al. | |
| 9,171,960 | B2 | 10/2015 | Hong et al. | |
| 9,368,737 | B2 | 6/2016 | Hwang et al. | |
| 2003/0232961 | A1* | 12/2003 | Manias | B82Y 30/00 528/272 |
| 2009/0081374 | A1 | 3/2009 | Yang et al. | |
| 2009/0081827 | A1 | 3/2009 | Yang et al. | |
| 2012/0052681 | A1 | 3/2012 | Marsh | |
| 2013/0270534 | A1 | 10/2013 | Hwang et al. | |
| 2014/0210835 | A1 | 7/2014 | Hong et al. | |
| 2014/0377955 | A1* | 12/2014 | Ellinger | H01L 21/02178 438/694 |
| 2014/0377963 | A1* | 12/2014 | Ellinger | H01L 21/02642 438/763 |
| 2017/0114451 | A1* | 4/2017 | Lecordier | C22B 5/12 |

FOREIGN PATENT DOCUMENTS

| | | | | |
|---|---|---|---|---|
| JP | 2002343858 A | | 11/2002 | |
| JP | 2004-259661 A | | 9/2004 | |
| JP | 2010-540773 A | | 12/2010 | |
| JP | 2011-501779 A | | 1/2011 | |
| JP | 2013-254874 A | | 12/2013 | |
| JP | 2013/545286 | * | 12/2013 | |
| JP | 2013-545286 A | | 12/2013 | |
| WO | WO 98/08906 | * | 3/1998 | C09D 163/00 |
| WO | WO 2010/033542 | * | 3/2010 | C08K 5/05 |
| WO | WO 2014/116500 A1 | | 7/2014 | |

OTHER PUBLICATIONS

Tan, Shaobo, et al., "Synthesis of fluoropolymer containing tunable unsaturation by a controlled dehydrochlorination of P9VDF-co-CTFE) and its curing for high performance rubber applications". J. Mater. Chem., 2012, 22, 18496-18504.*

International Search Report issued in International Application No. PCT/JP2016/057067, dated May 31, 2016.

Sinha et al., "Area selective atomic layer deposition of titanium dioxide: Effect of precursor chemistry," J. Vac. Sci. Technol. B vol. 24(6), 2006, pp. 2523-2532.

Written Opinion of the International Searching Authority issued in International Application No. PCT/JP2016/057067, dated May 31, 2016.

* cited by examiner

ATOMIC LAYER DEPOSITION-INHIBITING MATERIAL

CROSS REFERENCE TO RELATED APPLICATIONS

The present application is a continuation of International application No. PCT/JP2016/057067, filed Mar. 8, 2016, which claims priority to Japanese Patent Application No. 2015-051240, filed Mar. 13, 2015, the entire contents of each of which are incorporated herein by reference.

FIELD OF THE INVENTION

The present invention relates to a selective film formation method onto a substrate with the use of an atomic layer deposition method.

BACKGROUND OF THE INVENTION

Atomic layer deposition methods (ALD: Atomic layer deposition) are used for the manufacture of various electronic components, for example, capacitors and semiconductor devices, and for examples, conductive thin films such as electrodes or wirings and insulating thin films such as dielectric layers are formed by ALD. In the case of forming such thin films, in particular, conductive thin films as electrodes or wirings, there is a need for patterning techniques for forming thin films in predetermined shapes in predetermined locations on substrates. There are some reports as patterning techniques in thin film formation with the use of ALD. For example, Non-Patent Document 1 discloses therein that in the case of forming a film of $TiO_2$ by ALD from a combination of titanium isopropoxide (TiIP) and water vapor ($H_2O$), due to the fact that no $TiO_2$ film is formed on polymethylmethacrylate (PMMA), a $TiO_2$ film can be selectively formed by patterning on a substrate with the polymethylmethacrylate as an atomic layer deposition-inhibiting material. In addition, Patent Documents 1 and 2 disclose therein the use of various polymers typified by acrylic resins and organosiloxane as atomic layer deposition-inhibiting materials allows for selective film formation Patent Document 1: Japanese Patent Application Laid-Open No. 2010-540773

Patent Document 2: Japanese Patent Application Laid-Open No. 2011-501779

Non-Patent Document 1: Area selective atomic layer deposition of titanium dioxide: Effect of precursor chemistry, J. Vac. Sci. technol. B 24(6)

SUMMARY OF THE INVENTION

The patterning techniques as mentioned above are limited on ALD conditions, in particular, temperature, and for example, the method in Non-Patent Document 1 is not allowed to be used under conditions in excess of 200° C. due to pyrolysis of PMMA, whereas the method in the cited references 1 and 2 are not allowed to be used under conditions in excess of 250° C. for the same reason. In addition, studies by the inventors have found that conventional patterning techniques may have insufficient inhibiting effects.

Therefore, an object of the present invention is to provide an atomic layer deposition-inhibiting material which can be used under a high-temperature condition, and has a great inhibiting effect.

The inventors have found, as a result of earnestly carrying out studies in order to solve the problems mentioned above, that the use of a specific fluorine-containing resin, in particular, a fluorine-containing resin that has a high fluorine content, has at least one tertiary carbon atom and a quaternary carbon atom, and has no functional group can achieve an adequate atomic layer deposition-inhibiting effect even under high-temperature conditions.

According to a first aspect of the present invention, an atomic layer deposition-inhibiting material is provided which includes a fluorine-containing resin that has a fluorine content of 30 at % or more, has at least one of tertiary carbon atom and quaternary carbon atom, and lacks an ester group, a hydroxyl group, a carboxyl group, and an imide group.

According to a second aspect of the present invention, an atomic layer deposition-inhibiting material is provided which includes a fluorine-containing resin that has a fluorine content of 30 at % or more, where the rate of decrease in fluorine content is 50% or less when subject to atomic layer deposition at 250° C. The rate of decrease is calculated according to the formula (A-B)/A×100(%), where A is the fluorine content of the fluorine-containing resin, and B is the fluorine content during atomic layer deposition at 250° C.

According to a third aspect of the present invention, an atomic layer deposition-inhibiting material is provided which includes a fluorine-containing resin, where the material has a fluorine content of 25 at % or more after atomic layer deposition at 250° C.

According to a fourth aspect of the present invention, an atomic layer deposition-inhibiting material is provided which includes a fluorine-containing resin represented by the following formula (I):

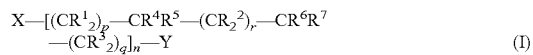

where:

X and Y each independently represent H, F, or $CR^{11}_3$;

$R^{11}$ each independently represents H or F;

$R^1$, $R^2$, and $R^3$ each independently represent H or F;

$R^4$ and $R^6$ each independently represent H, F, or an alkyl group having 1 to 6 carbon atoms, which may be substituted with fluorine;

$R^5$ and $R^7$ each independently represent an alkyl group having 1 to 6 carbon atoms, which may be substituted with fluorine; or $R^5$ and $R^7$ may together form a group represented by the following formula:

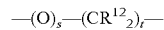

where $R^{12}$ represents H, F, or an alkyl group having 1 to 6 carbon atoms, which may be substituted with fluorine, s represents an integer of 0 to 2, and t represents an integer of 1 to 6, and where the presence order of O and $CR^{12}_2$ is not limited to the order mentioned, but may be any order; p, q, and r each independently represent an integer of 0 to 6; and n is any natural number.

According to a fifth aspect of the present invention, a method for forming a thin-film pattern of an inorganic material on a substrate by an atomic layer deposition method is provided, which includes forming an atomic layer deposition-inhibiting layer pattern on the substrate with the use of the atomic layer deposition-inhibiting material mentioned above; and then forming a layer of inorganic material by an atomic layer deposition method, in a region where no atomic layer deposition-inhibiting layer is present.

According to a sixth aspect of the present invention, an electronic component is provided which includes a substrate, a fluorine-containing resin layer that has a fluorine content of 25 at % or more, and a layer of inorganic material formed by an atomic layer deposition method, and which is characterized in that the fluorine-containing resin layer is located adjacent to the layer of inorganic material.

According to a seventh aspect of the present invention, an electronic component is provided which includes a substrate, a fluorine-containing resin layer that has a fluorine content of 25 at % or more, and a layer of nitride, and which is characterized in that the fluorine-containing resin layer is located adjacent to the layer of nitride.

According to the present invention, the use of, as an atomic layer deposition-inhibiting material, a specific fluorine-containing resin, in particular, a fluorine-containing resin that has a high fluorine content, has at least one tertiary carbon atom and a quaternary carbon atom, and has no functional group can achieve an atomic layer deposition-inhibiting effect in a preferred manner even in the case of an atomic layer deposition method under a high-temperature condition, thereby forming thin films in desired patterns.

DETAILED DESCRIPTION OF PREFERRED EMBODIMENTS OF THE INVENTION

Figure 1:
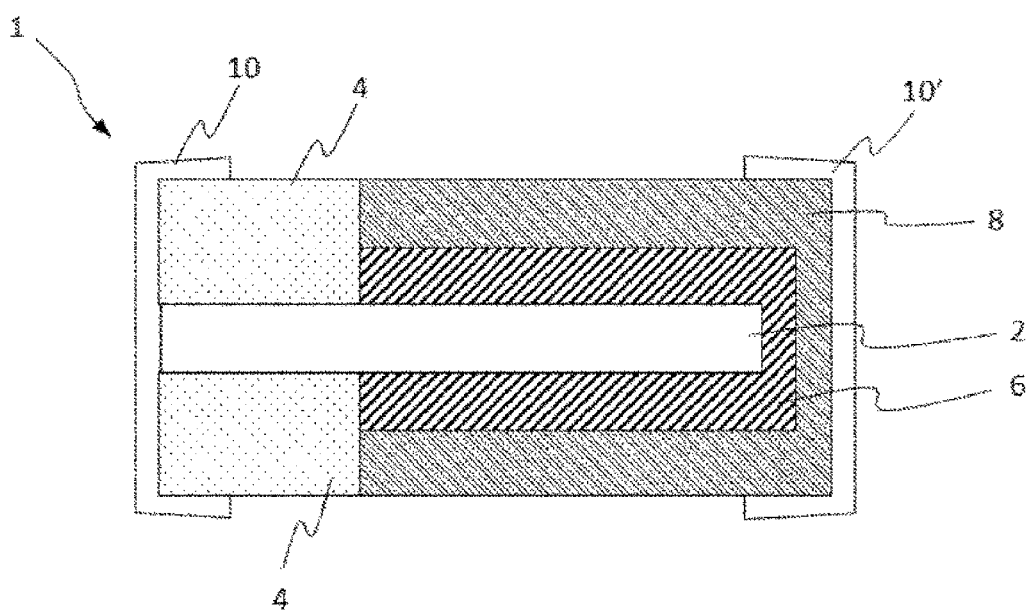
FIG. 1 is a cross-sectional view of a capacitor 1 manufactured through the use of the present invention.

The atomic layer deposition inhibiting material according to the present invention is composed of a fluorine-containing resin.

According to an embodiment, the fluorine content of the fluorine-containing resin is 30 at % or more, preferably 40 at % or more, and more preferably 50 at % or more. The fluorine content of 30 at % or more in the fluorine-containing resin further increases the atomic layer deposition-inhibiting effect. In addition, the upper limit of the fluorine content is not particularly limited, but may be a maximum fluorine content that can be achieved by the resin structure, that is, a fluorine content in the case of providing the resin with a perfluoro group.

The fluorine content in the fluorine-containing resin can be measured by methods known in the art, and for example, a cross section of the resin can be measured by scanning transmission electron microscope-energy dispersive X-ray spectroscopy (STEM-EDS: Scanning Transmission Electron Microscope-Energy Dispersive Spectroscopy), X-ray photoelectron spectrometry (XPS: X-ray Photoelectron Spectrometry), or the like.

According to this embodiment, the fluorine-containing resin has no functional group. The functional group refers to a group that is reactive with other molecules, and examples thereof include, for example, an ester group, a hydroxyl group, a carboxyl group, an imide group, an amide group, a sulfo group, an amino group, a thiol group, a nitro group, and a phenyl group. In the present invention, the term "to have no functional group" means that there is substantially no functional group in the fluorine-containing resin, but it is not necessary to be zero to none. The term of substantially no functional group means an amount that has no influence on the entire resin even when the resin is subjected to an ALD environment, and the functional group amount in the resin may be, but not particularly limited thereto, 1 mmol % or less with respect to the entire resin. The fluorine-containing resin has no functional group, thereby making it possible to produce a greater atomic layer deposition-inhibiting effect, even in ALD film formation at high temperatures (for example, 250° C. or higher). While the present invention is not intended to be bound by any theory, it is believed that under high-temperature conditions for ALD, the presence of functional groups will decrease the atomic layer deposition-inhibiting effect, because the functional groups are activated to promote, with the sites as base points, the decomposition of the resin.

The presence of any functional group in the fluorine-containing resin can be confirmed by methods known in the art, for example, from an infrared spectrum.

According to this embodiment, the fluorine-containing resin has at least one tertiary carbon atom and quaternary carbon atom. Preferably, monomer units of the fluorine-containing resin each have at least one tertiary carbon atom and quaternary carbon atom. The fluorine-containing resin has at least one tertiary carbon atom and a quaternary carbon atom, thereby making it possible to produce a greater atomic layer deposition-inhibiting effect, even in ALD film formation at high temperatures.

The presence of the tertiary carbon atom or quaternary carbon atom in the fluorine-containing resin can be confirmed by methods known in the art, for example, by $^{13}$C-NMR (DEPT method: Distorsionless Enhancement by Polarization Transfer).

According to another embodiment, the rate of decrease in fluorine content is 50% or less, preferably 30% or less, during atomic layer deposition at 250° C. The rate of decrease in fluorine content during the atomic layer deposition at 250° C. is adjusted to 50% or less so as to retain the function of the fluorine-containing resin as an atomic layer deposition-inhibiting material, and thus making it possible to achieve a greater atomic layer deposition-inhibiting effect.

As in the embodiment mentioned above, the fluorine content of the fluorine-containing resin is preferably 30 at % or more, and more preferably 50 at % or more. The fluorine content of 30 at % or more in the fluorine-containing resin further increases the atomic layer deposition-inhibiting effect.

According to this embodiment, the fluorine content of the fluorine-containing resin can be reduced as the rate of decrease in fluorine content is lower. However, as a matter of course, the rate of decrease in fluorine content is preferably lower, and the fluorine content is preferably higher.

According to this embodiment, preferably, the fluorine-containing resin can have no functional group and/or have at least one tertiary carbon atom and a quaternary carbon atom, as in the embodiment mentioned above.

According to yet another embodiment, the fluorine content of the fluorine-containing resin after atomic layer deposition at 250° C. is 25 at % or more, preferably 40 at % or more, and further preferably 50 at % or more. The fluorine-containing resin after atomic layer deposition at 250° C. has a fluorine content of 25 at % or more, thereby making it possible to produce a greater atomic layer deposition-inhibiting effect.

According to this embodiment, preferably, the fluorine content is 30 at % or more, and more preferably 50 at % or more as in the embodiment mentioned above. In addition, preferably, the fluorine-containing resin can have no functional group and/or have at least one tertiary carbon atom and a quaternary carbon atom.

According to yet another embodiment, the fluorine-containing resin mentioned above is a fluorine-containing resin represented by the following formula (I):

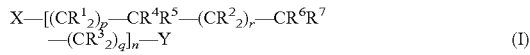

$$X-[(CR^1{}_2)_p-CR^4R^5-(CR^2{}_2)_r-CR^6R^7-(CR^3{}_2)_q]_n-Y \quad (I)$$

In the formula mentioned above, X and Y each independently represent H, F, or $CR^{11}{}_3$. The $R^{11}$ each independently represents H or F. Preferably, X and Y each independently represent F or $CF_3$.

In the formula, $R^1$, $R^2$, and $R^3$ each independently represent H or F, and preferably, $R^1$, $R^2$, and $R^3$ all represent F.

In the formula, $R^4$ and $R^6$ each independently represent H, F, or an alkyl group having 1 to 6 carbon atoms (one or more and six or less carbon atoms), which may be substituted with fluorine. The alkyl group having 1 to 6 carbon atoms may be straight chain or branched chain, and is preferably an alkyl group having 1 to 3 carbon atoms, in particular, preferably a methyl group. The alkyl group mentioned above is preferably fully substituted with fluorine, that is, preferably a perfluoroalkyl group. A preferred perfluoroalkyl group is a trifluoromethyl group. $R^4$ and $R^6$ are preferably F or a perfluoroalkyl group having 1 to 6 carbon atoms, more preferably F or a trifluoromethyl group.

In the formula, $R^5$ and $R^7$ each independently an alkyl group having 1 to 6 carbon atoms, which may be substituted with fluorine. The alkyl group having 1 to 6 carbon atoms, which may be substituted with fluorine, is preferably a perfluoroalkyl group, more preferably a perfluoroalkyl group having 1 to 3 carbon atoms.

In addition, $R^5$ and $R^7$ may together form a group represented by the following formula:

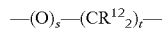

$$-(O)_s-(CR^{12}{}_2)_t-$$

where $R^{12}$ represents H, F, or an alkyl group having 1 to 6 carbon atoms, which may be substituted with fluorine, s represents an integer of 0 or more and 2 or less, and t represents an integer of 1 or more and 6 or less, where the presence order of O and $CR^{12}{}_2$ are not limited to the order mentioned, but may be any order.

In this case, $R^5$ and $R^7$ form, with a carbon atom and a $-(CR^2{}_2)_r-$ group bonded thereto, a ring that has the following structure.

[Chemical Formula 1]

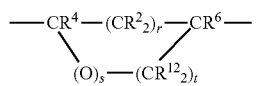

In the formula, the presence order of the respective units (O and $CR^{12}{}_2$) in brackets with s or t is any order in the formula. For example, when s and t are respectively 1 and 2, the respective units may be any of $-O-CR^{12}{}_2-CR^{12}{}_2-$, $-CR^{12}{}_2-O-CR^{12}{}_2-$, and $-CR^{12}{}_2-CR^{12}{}_2-O-$.

$R^{12}$ preferably represents F or a perfluoroalkyl group having 1 to 6 carbon atoms, more preferably F or a trifluoromethyl group.

Preferred $-(O)_s-(CR^{12}{}_2)_t-$ is $-O-CR^{12}{}_2-O-$ or $-(CF_2)_a-O-(CF_2)_b-(CFR^{12})_c-$ (in the formula, a represents an integer of 0 or more and 5 or less, b is an integer of 0 or more and 4 or less, and c is 0 or 1). More preferred $-(O)_s-(CR^{12}{}_2)_t-$ is $-O-C(CF_3)_2-O-$ or $-O-CF_2-CF_2-$.

In the formula mentioned above, p, q, and r each independently represent an integer of 0 or more and 6 or less. Preferably, p and q represent an integer of 0 or more and 2 or less, and r represents 0 or 1.

In the formula, n is any natural integer. n is not particularly limited, but can fall within the range of, for example, 5 or more and 10000 or less.

Examples of preferred fluorine-containing resins include, for example, fluorine-containing resins that have the following structure:

[Chemical Formula 2]

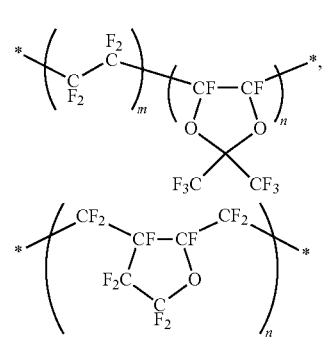

These are respectively commercially available as trade name "Teflon (registered trademark) AF" from Du Pont Kabushiki Kaisha and as trade name "CYTOP (registered trademark)" from Asahi Glass Co., Ltd.

The use of the fluorine-containing resin represented by the formula (1) mentioned above can achieve a greater atomic layer deposition-inhibiting effect.

According to a preferred embodiment, the fluorine-containing resin mentioned above contains no hydrogen atom.

More specifically, the fluorine-containing resin is composed of carbon atoms, fluorine atoms, and if desired, oxygen atoms.

The number average molecular weight of the fluorine-containing resin mentioned above is not particularly limited, but preferably 10000 or more, and for example, 10000 or more and 1000000 or less, preferably 20000 or more and 500000 or less.

The use of the atomic layer deposition-inhibiting material composed of the fluorine-containing resin mentioned above can form a thin-film pattern on a substrate in a favorable manner, even under severe conditions such as high-temperature (for example, 250° C. or higher or 300° C. or higher) conditions.

Therefore, the present invention also provides a method for forming a thin-film pattern of an inorganic material on a substrate by an atomic layer deposition method, which includes forming an atomic layer deposition-inhibiting layer pattern on the substrate with the use of the atomic layer deposition-inhibiting material composed of the fluorine-containing resin mentioned above; and then forming a layer of inorganic material by an atomic layer deposition method, in a region where no atomic layer deposition-inhibiting layer is present.

The method according to the present invention will be described below with reference to the drawings, as an example of using the method in the manufacture of the capacitor shown in FIG. 1. However, it is to be noted that the present invention is not limited to the following embodiment.

As shown in FIG. 1, a capacitor 1 manufactured according to the present embodiment schematically has a lower electrode 2 as a substrate, atomic layer deposition-inhibiting layers 4 formed thereon, a dielectric layer 6 and an upper electrode 8 sequentially formed on the substrate 2 to be adjacent to the atomic layer deposition-inhibiting layers 4, and terminal electrodes 10, 10' formed on the ends. One terminal electrode 10 is electrically connected to the lower electrode 2, and electrically isolated from the upper electrode 8. On the other hand, the other terminal electrode 10' is electrically connected to the upper electrode 8, and electrically isolated from the lower electrode 2.

Figure 2A:
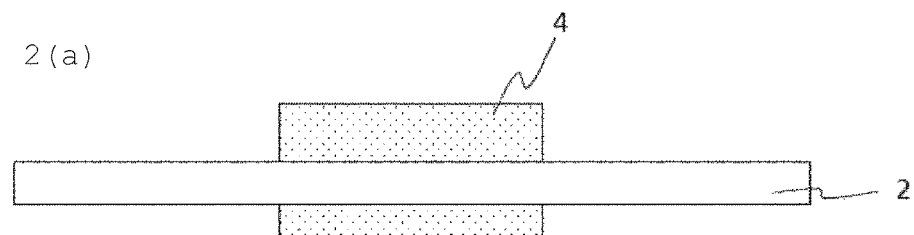
FIGS. 2(a) to 2(c) are diagrams for explaining steps for manufacturing the capacitor 1 manufactured with the use of the present invention.

First, the substrate (lower electrode 2) is prepared. Then, on the substrate 2, the atomic layer deposition-inhibiting material composed of the fluorine-containing resin as mentioned above is applied to predetermined sites through the use of a printing technique such as screen printing and ink-jet printing, thereby forming the atomic layer deposition-inhibiting layers 4 (FIG. 2(a)). It is to be noted that the method for forming the atomic layer deposition-inhibiting layers 4 is not limited to the printing technique mentioned above, or not particularly limited as long as the method can apply the atomic layer deposition-inhibiting material to predetermined locations of the substrate to form the atomic layer deposition-inhibiting layers.

Figure 2B:
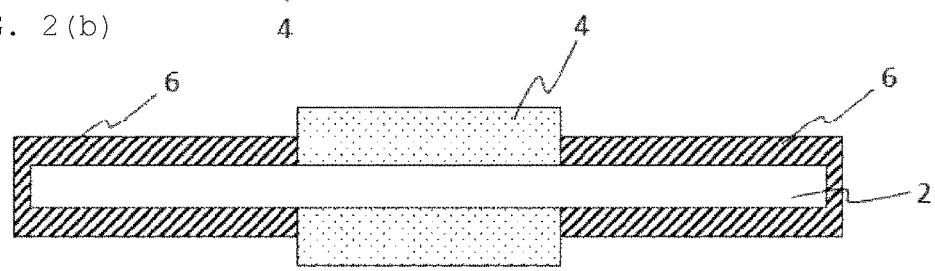

Then, on the substrate 2 with the atomic layer deposition-inhibiting layer 4 is formed, the dielectric layer 6 is formed with the use of an atomic layer deposition method. In this regard, the dielectric layer 6 is not formed over the atomic layer deposition-inhibiting layer 4 (FIG. 2(b)). The material that forms the dielectric layer 6 is not particularly limited as long as the material has an insulating property, but examples thereof preferably include metal oxides such as $AlO_x$ (e.g., $Al_2O_3$), $SiO_x$ (e.g., $SiO_2$), $AlTiO_x$, $SiTiO_x$, $HfO_x$, $TaO_x$, $ZrO_x$, $HfSiO_x$, $ZrSiO_x$, $TiZrO_x$, $TiZrWO_x$, $TiO_x$, $SrTiO_x$, $PbTiO_x$, $BaTiO_x$, $BaSrTiO_x$, $BaCaTiO_x$, and $SiAlO_x$; metal nitrides such as $AlN_x$, $SiN_x$, and $AlScN_x$; or metal oxynitrides such as $AlO_xN_y$, $SiO_xN_y$, $HfSiO_xN_y$, and $SiC_xO_yNz$ (x and y represent any number).

Figure 2C:
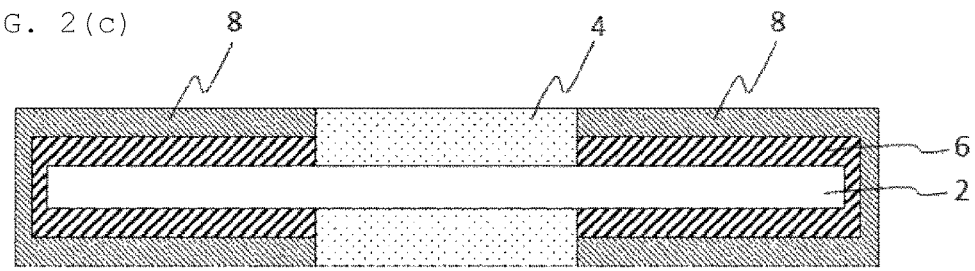

Then, on the dielectric layer 6, the upper electrode 8 is formed with the use of an atomic layer deposition method. In this regard, the upper electrode 8 is not formed over the atomic layer deposition-inhibiting layer 4 (FIG. 2(c)). The material constituting the upper electrode is not particularly limited as long as the material has a conductive property, but examples of the material include Ni, Cu, Al, W, Ti, Ag, Au, Pt, Zn, Sn, Pb, Fe, Cr, Mo, Ru, Pd, and Ta and alloy layers thereof, e.g., CuNi, AuNi, AuSn, as well as metal oxides and metal oxynitrides such as TiN, TiAlN, TiON, TiAlON, TaN, and TiN and TiON are preferred.

Figure 2D:
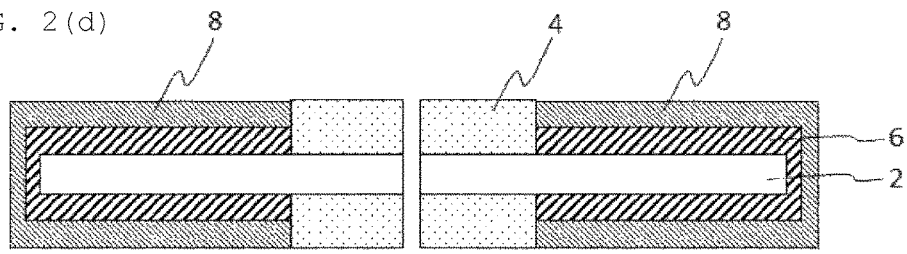
FIGS. 2(d) to 2(e) are diagrams for explaining steps for manufacturing the capacitor 1 manufactured with the use of the present invention.
Figure 2E:
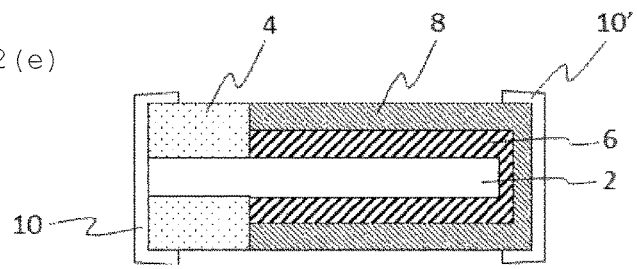

The laminated body obtained in the way mentioned above is cut at an intermediate position of the atomic layer deposition-inhibiting layer 4 (FIG. 2(d)), and finally, the terminal electrodes 10, 10' are formed by plating (FIG. 2(e), thereby manufacturing the capacitor 1 according to the present embodiment.

The method according to the present invention, in the formation of the dielectric layer 6 and the upper electrode 8, can form the layers in desired patterns without forming the layers on the atomic layer deposition-inhibiting layers 4. According to the embodiment mentioned above, when a conductive substance adheres onto the atomic layer deposition-inhibiting layers 4 in the formation of the upper electrode 8, there is a possibility that the insulation between the terminal electrode 10 and the upper electrode 8 will be decreased, thereby causing a short circuit between the upper electrode 8 and the lower electrode 2 through the terminal electrode 10. The present invention is advantageous in that this possibility can be substantially eliminated. In particular, in the case of using a nitride (for example, TiN) as a material that forms the upper electrode, the present invention is advantageous extremely, because atomic layer deposition is carried out under a severer condition.

It is to be noted that while the lower electrode is used as a substrate according to the embodiment mentioned above, the present invention is not limited thereto, but various substrates, for example, other conductive substrates, insulating substrates, and semiconductor substrates can be used. In addition, the present invention is not limited to any embodiments where atomic layer deposition-inhibiting layers are formed directly on a substrate, but other layers may be formed on the substrate. For example, in the embodiment mentioned above, a buffer layer may be formed on the lower electrode 2, and each atomic layer deposition-inhibiting layer may be formed thereon.

In an electronic component formed with the use of the method according to the present invention, on a substrate, an atomic layer deposition-inhibiting layer composed of a fluorine-containing resin is typically located adjacent to a layer of inorganic material formed by an atomic layer deposition method.

Therefore, the present invention also provides an electronic component including a substrate, a fluorine-containing resin layer that has a fluorine content of 25 at % or more, and a layer of inorganic material formed by an atomic layer deposition method, characterized in that the fluorine-containing resin layer is located adjacent to the layer of inorganic material.

It is to be noted that the above-mentioned term adjacent means that the fluorine-containing resin layer and the layer of inorganic material are substantially in contact with each other. The term substantially in contact encompasses not only direct contact, but also, for example, contact with a void (several nm) therebetween that allows no gas penetration in the film formation by ALD.

As mentioned above, a severe condition, for example, a condition of 250° C. or higher is required in the case of forming a nitride by an atomic layer deposition method, and the use of the atomic layer deposition-inhibiting material according to the present invention is extremely advantageous.

Therefore, according to another embodiment, the present invention provides an electronic component including a substrate, a fluorine-containing resin layer that has a fluorine content of 25 at % or more, and a layer of nitride, characterized in that the fluorine-containing resin layer is located adjacent to the layer of nitride.

According to the present invention, the above-mentioned layer of inorganic material or nitride is not substantially present on the upper surface (the surface opposed to the surface on the substrate side) of the atomic layer deposition-inhibiting layer.

In the inventive electronic component mentioned above, the fluorine content of the fluorine-containing resin layer is preferably 40 at % or more. In addition, the fluorine-containing resin layer mentioned above preferably lacks an ester group, hydroxyl group, carboxyl group, and imide group.

The inorganic material mentioned above is preferably a nitride. Examples of the nitride include, for example, TiN, AlN, or SiN.

Figure 3:
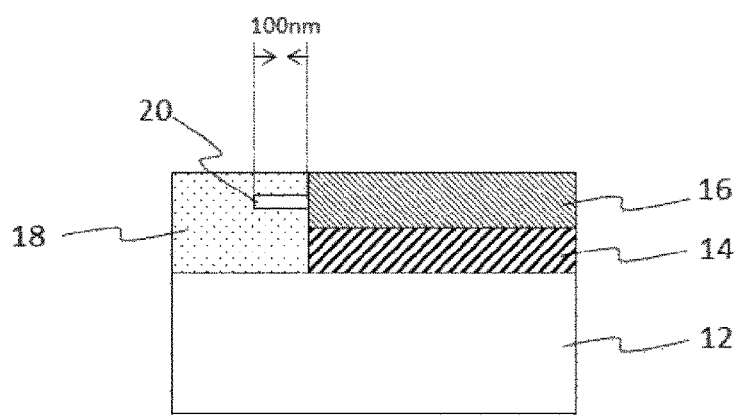
FIG. 3 is a diagram illustrating a region for measuring the fluorine content in the fluorine-containing resin after an atomic layer deposition method.

It is to be noted that the fluorine content in the fluorine-containing resin layer mentioned above refers to an average value for fluorine content in a region of 100 nm inside the fluorine-containing resin (for example, a region shown in FIG. 3) from the interface between the fluorine-containing resin layer and the inorganic material (or nitride).

The electronic component mentioned above is not limited to the capacitor mentioned above, but may be another electronic component, for example, a transistor, a circuit substrate, a semiconductor device, or the like.

While the present invention has been described above, the present invention is not to be considered limited to the foregoing, but various modifications can be made to invention.

EXAMPLE

On an Al substrate of approximately 10 cm on a side, grid-like patterns of 1 mm in line width respectively with the film thicknesses shown in Table 1 below at a pitch of 6 mm were formed by screen printing through the use of a dispenser with the use of the materials A to E shown in Table 1 below. Then, on the substrate with the pattern formed, an atomic layer deposition method was used to form a film of AlOx (Raw Material: trimethylaluminum; Condition: 180 cycles; 250° C.) as an insulating layer, and a TiN film (Raw Material: tetrakis(dimethylamino)titanium and ammonia; Condition: 100 cycles; 250° C.) as an electrode layer. It is to be noted that the materials D and E are considered as examples. The material A is a resin containing no fluorine, the material B is a fluorine-containing resin having an ester linkage in a molecule, and the material C is a fluorine-containing resin having —Si(OH)$_3$ at the terminal end, and these materials are considered as comparative examples.

TABLE 1

| Atomic Layer Deposition- Inhibiting Material | Resin | Film Thickness |
| --- | --- | --- |
| Material A | PMMA | Approximately 1 μm |
| Material B | WOP-197 (Noda Screen Co., LTD.) | Approximately 1 μm |
| Material C | KY-108 (Shin-Etsu Chemical Co., Ltd.) | Approximately 10 nm |
| Material D | Structure 1 | Approximately 1 μm |
| Material E | Structure 2 | Approximately 1 μm |

[Chemical Formula 3]

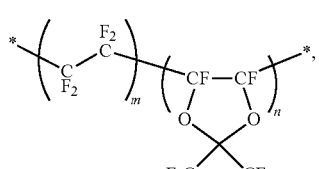

End Group = CF$_3$

Structure 1

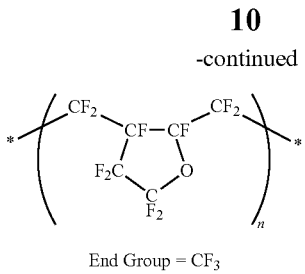

End Group = CF$_3$

Structure 2

Evaluation

Electrical Resistance Value of Resin Application Part

The electrical resistance value of the resin application part after the film formation (the resistance value between adjacent cells formed by the lattice of the resin application part) was measured by a two-terminal method. The results are shown in Table 2 below.

X-ray Photoelectron Spectroscopy (XPS: X-ray Photoelectron Spectroscopy) Analysis of Resin Application Part In addition, for the materials B, D, and E of high resistance value, the resin application parts were subjected to surface analysis with an X-ray photoelectron spectrometer before and after the ALD. The results are shown together in Table 2 below. The measurement points were spots of 2 nm in diameter near the centers of lattice intersections.

TABLE 2

| ALD Inhibiting Material | Resistance Value | | XPS Analysis (at %) | | | | | |
| --- | --- | --- | --- | --- | --- | --- | --- | --- |
| | | | C | N | O | F | Al | Ti |
| Material A | 445 kΩ | Before ALD | — | — | — | — | — | — |
| | | After ALD | — | — | — | — | — | — |
| Material B | 100 MΩ or more | Before ALD | 64.2 | — | 11.6 | 24.2 | — | — |
| | | After ALD | 48.0 | 9.7 | 26.1 | 2.6 | — | 13.6 |
| Material C | 5934 kΩ | Before ALD | — | — | — | — | — | — |
| | | After ALD | — | — | — | — | — | — |
| Material D | 100 MΩ or more | Before ALD | 35.6 | — | 5.0 | 59.4 | — | — |
| | | After ALD | 39.6 | — | 6.0 | 54.4 | — | — |
| Material E | 100 MΩ or more | Before ALD | 35.6 | — | 5.0 | 59.4 | — | — |
| | | After ALD | 42.6 | 2.0 | 13.3 | 41.3 | — | 0.8 |

Fluorine Content after ALD

The sample after the ALD was processed with focused ion beams (FIB: Focused Ion Beam) to expose a cross section. The average fluorine amount in a region (see FIG. 3) of 100 nm from the interface between the TiN film and the resin layer in the cross section was measured with a STEM-EDS measurement system (STEM: JEOL Ltd. (JEM-2200FS), EDS detector: JEOL Ltd. (dry SD60GV), EDS system: Thermo Fisher Scientific K.K. (Noran system 7)).

The result was that the resins D and E were 30 at % or more in fluorine content. On the other hand, the fluorine content was slight (3 at % or less) in the resin B, and there was almost no fluorine in the resin C (lower limit of determination or less).

As is clear from the foregoing results, in the case of using the materials D and E of 30 at % or more in fluorine content without any functional group, the resin application parts maintained high resistance values even after the ALD, and there was almost no Ti on the resins.

On the other hand, in the case of using the material A as a resin containing no fluorine and the material C having the functional group at the terminal end, the resin application parts decreased significantly in resistance value after the ALD, and there was a lot of Ti on the resins. In the case of using the material B having ester linkage, there was Ti on the resin while the resistance value was high, thereby resulting in an inadequate ALD inhibiting effect. From the foregoing, it has been confirmed that the ALD inhibiting materials within the scope of the present invention have extremely favorable ALD inhibiting effects. In addition, it has been confirmed that the resins that have great ALD inhibiting effects are high in fluorine content even after the ALD. Further, although not described herein, it has been confirmed that similar effects are achieved in the case of ZrOx, SiOx, AlN, SiN, Al, Cu, and Zr.

Example 2

On an Al substrate of approximately 10 cm on a side, a film of AlOx (Raw Material: trimethylaluminum; Condition: 180 cycles; 250° C.) was formed with the use of an ALD method. Then, as in Example 1, grid-like patterns were formed by a screen printing method with the use of a resin D and a resin D' of the resin D with a terminal end of COOH. Then, a TiN film was formed with the use of an ALD method (Raw Material: tetrakis(dimethylamino)titanium and ammonia; Condition: 100 cycles; 310° C.)

Evaluation

As in Example 1, the resin application parts were subjected to surface analysis with an X-ray photoelectron spectrometer before and after the ALD. The results are shown in Table 3 below.

TABLE 3

| ALD Inhibiting Material | | XPS Analysis (at %) | | | | | |
|---|---|---|---|---|---|---|---|
| | | C | N | O | F | Al | Ti |
| Material D | Before ALD | 35.6 | — | 5 | 59.4 | — | — |
| | After ALD | 37.5 | 0.3 | 5.3 | 56.9 | — | — |
| Material D' | Before ALD | 35.3 | — | 11 | 53.8 | — | — |
| | After ALD | 39.5 | 14.7 | 27.4 | 1.9 | — | 16.6 |

As is clear from the foregoing results, the resin D within the scope of the present invention produced a favorable ALD inhibiting effect even in the case of the film formation at 310° C. On the other hand, in the case of the resin D' having the COOH group at the terminal end, there was a lot of Ti on the resin surface after the ALD.

While the present invention is not intended to be bound by any theory, this is believed to be because, with the terminal end of COOH as an active site in the resin D', the degradation or decomposition of the resin proceeded, thereby failing to achieve an adequate ALD inhibiting effect.

Comparative Example

Films of AlOx and TiN were formed continuously in the same way as in Example 1, except for the use of, as an ALD inhibiting material, polytetrafluoroethylene (PTFE) of approximately 50 at % in fluorine content, and the temperature condition changed for the ALD method (Low Temperature: approximately 235° C.; High Temperature: approximately 280° C.)

As a result of carrying out an XPS analysis on the resin after the ALD, an ALD inhibiting effect has been confirmed only in the case of the low temperature (approximately 235° C.). In the case of the high temperature (approximately 280° C.), it has been confirmed that the inhibiting effect of the ALD film is lost, with Ti observed on the PTFE.

While the present invention is not intended to be bound by any theory, this is believed to be because depolymerization is more likely to be developed during the ALD, due to the fact that the PTFE has a high fluorine content, but contains only a primary carbon atom and a secondary carbon atom.

DESCRIPTION OF REFERENCE SYMBOLS

1: capacitor
2: substrate (lower electrode)
4: atomic layer deposition-inhibiting layer
6: dielectric layer
8: upper electrode
10, 10': terminal electrode
12: aluminum substrate
14: $AlO_x$ layer
16: TiN layer
18: resin layer
20: measurement region

The invention claimed is:

1. An atomic layer deposition-inhibiting material comprising a fluorine-containing resin represented by the following formula (I):

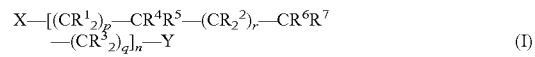

(I)

where:
X and Y each independently is H, F, or $CR^{11}_3$;
$R^{11}$ each independently is H or F;
$R^1$, $R^2$, and $R^3$ each independently is H or F;
$R^4$ and $R^6$ each independently is H, F, or an alkyl group having 1 to 6 carbon atoms;
$R^5$ and $R^7$ each independently is an alkyl group having 1 to 6 carbon atoms; or
$R^5$ and $R^7$ may together form a group represented by the following formula:

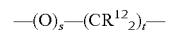

where
$R^{12}$ represents H, F, or an alkyl group having 1 to 6 carbon atoms,
s represents an integer of 0 to 2, and t represents an integer of 1 to 6;
p, q, and r each independently is an integer of 0 to 6; and
n is a natural number.

2. The atomic layer deposition-inhibiting material according to claim 1, wherein the fluorine-containing resin comprises a resin represented by the formula (I):
$R^1$ and $R^3$ are F, p is 1 or 2,
$R^4$ and $R^6$ are F,
$R^5$ and $R^7$ together form —O—$CF_2$—$CF_2$— or —O—CF$(CF_3)_2$—O—,
q is 0 or 1, and
r is 0.

3. The atomic layer deposition-inhibiting material according to claim 1, wherein the fluorine-containing resin comprises no hydrogen atom.

\* \* \* \* \*